United States Patent [19]

Torii

[11] Patent Number: 5,401,713
[45] Date of Patent: Mar. 28, 1995

[54] OXIDE-TYPE SUPERCONDUCTING MATERIAL

[75] Inventor: Yasuko Torii, Osaka, Japan

[73] Assignee: Sumitomo Electric Industries, Ltd., Japan

[21] Appl. No.: 947,887

[22] Filed: Sep. 18, 1992

Related U.S. Application Data

[63] Continuation of Ser. No. 696,282, Apr. 25, 1991, abandoned, which is a continuation of Ser. No. 365,414, Jun. 13, 1989, abandoned.

[30] Foreign Application Priority Data

Feb. 6, 1989 [JP] Japan .................................. 1-27305
May 19, 1989 [JP] Japan ................................ 1-125859

[51] Int. Cl.$^6$ .......................................... H01L 39/12
[52] U.S. Cl. ................................. 505/120; 505/782; 505/783; 501/123; 252/521; 423/604
[58] Field of Search ................. 565/1, 782, 783; 501/123; 252/521; 423/604; 505/1, 782, 783

[56] References Cited

U.S. PATENT DOCUMENTS

| | | | |
|---|---|---|---|
| 3,932,315 | 1/1976 | Sleight | 505/802 |
| 4,870,052 | 9/1989 | Engler et al. | 501/123 |
| 4,894,361 | 1/1990 | Susramanian | 501/123 |
| 4,921,834 | 5/1990 | Hasegawa | 505/1 |
| 5,140,000 | 8/1992 | Tallon | 505/1 |

FOREIGN PATENT DOCUMENTS 0277749 8/1988 European Pat. Off.
2307823 12/1990 Japan .................................. 505/783

OTHER PUBLICATIONS

Iyer "Insensitivity of Tc to high K substitution . . . " *Physica C*. vol. 152 (5) Jul. 1, 1988, pp. 505–507 (Abstract).
Sequeira "Evidence for K–substitution in the Tl–sites . . . " *Physica C* vol. 156 (4) Nov. 1, 1983 pp. 599–603 (Abstract).
Schaller "Structure of High $T_c$ oxide superconductors" *MRS Bulletin* vol. 14 Jan. 1989 pp. 27–30.
Jin "Transport measurement of 32K . . . in Ba–K–Bi–O . . . " *Appl. Phys. Lett.* vol. 53 (12) Sep. 12, 1988 pp. 1116–1118.
Honda "Preparation of High–Tc (105K) . . . Bi–Sr–K–Ca–Cu . . . " *Jap. Intl. Appl. Phys.* vol. 27(4) Apr. 1988 pp. 545–547
Subramanian "Superconducting and Magnetic . . . in La$_{z-x}$Na$_x$CuO$_4$" *Science* vol. 240 Apr. 22, 1988 pp. 495–497.
Tai "Bulk Superconductivity in the new orthorhombic . . . " *Jap. Inl. Appl. Phys.* vol. 27(12) Dec. 1988 pp. L2287–L2288.
Yamada "Pb Introduction to the High–Tc Syp. Bi–Sr–Ca–Cu–O" *Jap. Jnl. Appl. Physics* vol. 27(6) Jun. 1988 pp. L996–L998.

(List continued on next page.)

Primary Examiner—Paul Lieberman
Assistant Examiner—M. Kopec
Attorney, Agent, or Firm—Bierman and Muserlian; Jordan B. Bierman

[57] ABSTRACT

A new superconducting material composed mainly of compound oxide represented by the general formula:

$$Tl_h Ca_j \alpha_{k(1-y)} \beta_{ky} Cu_m O_n$$

wherein
"$\alpha$" represents Ba or Sr;
"$\beta$" represents any one of elements selected from a group comprising Na, K, Rb and Cs;
"h", "j", "k", "m" and "n" are the atomic ratios each satisfies the following range:
$1 \leq h \leq 3$, $1 \leq j \leq 3$, $1 \leq k \leq 3$,
$2 \leq m \leq 4$ and $5 \leq n \leq 15$ and
"y" is a number which satisfies a range of $0.05 \leq y \leq 0.8$.

3 Claims, 2 Drawing Sheets

OTHER PUBLICATIONS

Itoh "Preparation and Properties of Bulk . . . Tl–Pb–Sr–Ca–Cu–O . . . " *Jap. Jnl. Appl. Phys.* vol. 27(11) Nov. 1988 pp. L2052–L2054.

Takano "High–Tc Phase Promoted . . . in the Bi, Pb–Sr–La–Cu–O . . . " *Jap. Jnl. Appl. Phys.* vol. 27 No. 6 Jun. 1988 pp. L1041–L1043.

Saito "High–Tc Superconduct. Properties in . . . " *Physica 148B* 1987 pp. 336–338.

Ihara "A new high–Tc $TlBa_7Ca_3C_4O_{11}$ super conduct . . . " *Nature vol. 334* Aug. 11, 1988 pp. 510–511.

Torardi "Crystal structure of $Tl_2Ba_2Ca_2Cu_3O_{10}$, a 125 K . . . " *Science* vol. 240 Apr. 29, 1988 pp. 631–633.

Iyer "Insensitivity of Tc to High K substitution . . . " *Physica C vol. 152* 1988 pp. 505–507.

Sequeira "Evidence for K–substitution in the Tl–. . . " *Physica C* vol. 156 Nov. 1, 1988 pp. 599–603.

Katsui "Crystal growth of Superconducting Bi–Sr–Ca–Cu–O . . . " *Jap. Jnl. Appl. Phys. vol. 27(5)* May 1988 pp. L844–L845.

Kanai "Dopant effects on the Superconductivity in the Bi–Sr–Ca–Cu–O . . . " *Jap. Inl. Appl. Physics* v. 28(4) Apr. 1989 pp. L551–L5554.

Sequeira "Evidence for K–substitution in the Tl–sites . . . " *Physica C 156* Nov. 1988 (Entire Article) pp. 599–603.

Iyer "Insensitivity of Tc to high K substitution . . . " *Physica C* vol. 152 Jul. 1, 1988 (entire Article) pp. 505–507.

Haldar "A new intermediate–Tc oxide . . . (Tl,Bi), $(Sr,Ca)_2Cu, O_{4.5+8}$" *Mat'l Letters* vol. 7(1,2) Aug. 1988 pp. 1–4.

OXIDE-TYPE SUPERCONDUCTING MATERIAL

This application is a continuation of application Ser. No. 07/696,282, filed Apr. 25, 1991, now abandoned, which is a continuation of application Ser. No. 07/365,414, filed Jun. 13, 1989, now abandoned.

BACKGROUND OF THE INVENTION

1. Field of the Invention

The present invention relates to oxide type superconducting materials. More particularly, it relates to a novel superconducting material of oxide having a higher critical temperature and a high critical current density.

2. Description of the Related Art

Since Bednorz and Müller discovered a compound oxide type superconductor of La—Sr—Cu system in 1986 [Z. Phys. B64 (1986) 189], new types of superconducting materials which have much higher Tc than the conventional superconductors have been reported successively.

In 1987, it was reported that C. W. Chu et al. discovered, in the United States of America, another superconducting material so called Y—Ba—Cu system having the critical temperature of about 90 K which is higher than the boiling point 77 K of liquid nitrogen (Physical Review letters, Vol. 58, No. 9, p 908).

Another type new superconducting material reported by Maeda et al. in Japan is a compound oxide of Bi—Sr—Ca—Cu system which have a critical temperature of higher then 100 K (Japanese Journal of Applied Physics. Vol. 27, No. 2, p 1209 to 1210).

Still another type new superconducting material reported by Hermann et al. in the United States of America is a compound oxide of Tl—Ba—Ca—Cu system which have a critical temperature of higher then 120 K. (Appl. Phys. Lett. 52 (20) p 1738).

The critical temperatures of the Bi-type superconductors and the Tl-type superconductors are fairly high than the boiling point of liquid nitrogen (77 K) and hence they are expected to be applicable in the actual utilization of high Tc superconductors.

These superconductors, however, are obtained as mixed phases: one phase showing the critical temperature of higher than 100 K and another phase showing the critical temperature of about 80 K and it is not easy to produce a compound oxide composed of a single phase of the high Tc alone, so that several ideas to produce a compound oxide consisting of the high Tc single phase alone have been proposed.

In the case of Bi—Sr—Ca—Cu system, it has been proposed to add lead (Pb) to the compound oxide of this system in order to increase the contents of the higher Tc phase. Although this solution is effective to improve the critical temperature, this process requires very long sintering time and the critical current density of the resulting compound oxide of Bi—Pb—Sr—Ca—Cu system is very low.

The compound oxide of Tl—Ba—Ca—Cu system contains several superconducting phases including $Tl_2Ca_2Ba_2Cu_3O_x$ and $Tl_2CaBa_2Cu_2O_y$ or the like. Although this superconductor shows a very high critical temperature of about 120 K, it is difficult to produce a compound oxide consisting of a single phase of the high Tc alone, because it is not easy to control precisely the composition of elements in a product because thallium (Tl) is a very volatile element due to its high vapour pressure. Still more, thallium is very toxic for human.

Therefore, an object of the present invention is to provide a novel superconducting material of compound oxide which shows almost same high level of critical temperature as the known Tl-system compound oxide and which can be produced stably.

SUMMARY OF THE INVENTION

A superconducting material according to the present invention is characterized in that the superconducting material is composed mainly of compound oxide represented by the general formula:

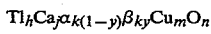

$$Tl_h Ca_j \alpha_{k(1-y)} \beta_{ky} Cu_m O_n$$

wherein

"$\alpha$" represents Ba or Sr;

"$\beta$" represents any one of elements selected from a group comprising Na, K, Rb an Cs;

"h", "j", "k", "m" and "n" are the atomic ratios each satisfies the following range:

$1 \leq h \leq 3$, $1 \leq j \leq 3$, $1 \leq k \leq 3$, $2 \leq m \leq 4$ and $5 \leq n \leq 15$ and "y" is a number which satisfies a range of $0.05 \leq y \leq 0.8$.

This system is similar to the known so-called Tl-system compound oxide so that the atomic ratios of "h", "j", "k", "m" and "n" are almost same as the known Tl-system compound oxide.

Improvement according to the present invention resides in that the Ia group element "$\beta$" selected from the group comprising Na, K, Rb and Cs is added to the known Tl-system. The element "$\beta$" is preferably cesium (Cs). According to the present invention, the value of "y" is selected in a range of $0.05 \leq y \leq 0.8$. If the value of "y" is not higher than 0.05, no advantage obtained by the addition of "y" according to the present invention can be expected. To the contrary, if the value of "y" exceeds 0.8, it becomes difficult to obtain the layered structure of tetragonal system which is considered to contribute to superconductivity and hence the superconducting property is spoiled.

According to an embodiment of the present invention, a portion of the thallium (Tl) element can be replaced by lead (Pb) and/or bismuth (Bi). In this case, the compound oxide is represented by the the general formula:

$$Tl_{h(1-p-q)} Bi_{hp} Pb_{hq} Ca_j \alpha_{k(1-y)} \beta_{ky} Cu_m O_n$$

wherein

"$\alpha$" represents Ba or Sr;

"$\beta$" represents any one of elements selected from a group comprising Na, K, Rb an Cs;

"h", "j", "k", "m" and "n" are the atomic ratios each satisfies the following range,:

$1 \leq h \leq 3$, $1 \leq j \leq 3$, $1 \leq k \leq 3$, $2 \leq m \leq 4$ and $5 \leq n \leq 15$ and "y", "p" and "q" are numbers each satisfying ranges of $0.05 \leq y \leq 0.8$, $0 \leq p \leq 0.5$ and $0 \leq q \leq 0.5$ respectively.

Addition of Pb and/or Bi or replacement of Tl by them contribute to make the product stable in the superconducting property. If the values of "p" and "q" exceeds 0.5, no advantage of stabilization is obtained.

The superconducting materials of compound oxides according to the present invention are preferably crystals each having a layered tetragonal system.

The composition of the superconducting material according to the present invention is similar to that of so-called Tl-system superconducting material but includes additionally an element selected from the group comprising Na, K, Rb and Cs which belong to Ia group of the periodic table.

We found such a fact that the superconducting material of Tl-system compound oxide which contains the Ia group element shows relatively lower melting point than the known Tl-system compound oxide which contains no Ia group element. This means that the superconducting compound oxide according to the present invention is produced at relatively lower temperatures which are just below the melting point, so that evaporation of thallium (Tl) is greatly reduced. As a result, not only pollution caused by toxic thallium vapour can be prevented but also it is possible to control the composition in the product precisely and to assure the selective formation of the high Tc phase which has a well-ordered crystalline structure. In fact, the superconducting compound oxide according to the present invention possesses the same as or even higher critical temperature than known Tl-system or Bi-system superconducting compound oxides and shows much higher critical current density than these known systems.

The superconducting material according to the present invention is prepared by the conventional sintering technique which itself is known in the field of oxide superconductors. The usual sintering process comprises preparing a material powder mixture, preferably compacting the material powder mixture and then subjecting the resulting compact to a final sintering operation.

The material powder mixture is preferably a powder mixture of constituent elements such as oxides or carbonates of the constituent elements contained in the general formula. The atomic ratios of constituent elements in the material powder are adjusted in such manner that the resulting sintered mass has the atomic ratio defined by the general formula with taking volatility of the constituent powders into consideration. An average particle size of the material powder mixture is preferably less than 10 $\mu$m in order to obtain a uniform composition.

According to a preferred embodiment, oxides or carbonates of the constituent elements except thallium (Tl) are firstly mixed intimately, sintered preliminarily and then pulverized. Then, the resulting preliminarily sintered powder is mixed with oxides or carbonates of thallium (Tl) to prepare the material powder mixture. This material powder mixture is preferably compacted by a press into a pellet or tablet before the sintering operation.

The sintering operation is preferably effected in a closed space in order to reduce loss of volatile elements such as thallium. In practice, the material powder mixture is enclosed in a foil made of gold during the sintering operation.

The sintering operation is preferably carried out at a temperature which is higher than 800° C., preferably about 850° C. for a duration of from 1 to 50 hours and preferably in an atmosphere containing oxygen gas.

The superconducting materials according to the present invention can be used in a form of a sintered mass or article as they are and are also used in a form of a powder which is prepared by pulverizing the sintered mass.

This powder-formed superconducting compound oxide can be used for producing a superconducting wire or the like. For example, the superconducting compound oxide powder obtained by the present invention is compacted in a metallic pipe which is then drawn into a fine wire or is mixed with suitable binder such as polybutylbutylal (PVB) to prepare a paste which can be molded into a desired configuration such as coils or yorks or which is coated or applied in a desired pattern. The resulting wire and the paste molded or coated are then sintered again.

As is described hereinbefore, the novel superconducting materials of compound oxides according to the present invention permit to produce products which are improved in quality because synthesis in solid phase can be effected at a relatively lower temperature which is just below the melting point due to the addition of Ia group element and hence precise control in composition can be assured.

The superconducting compound oxide according to the present invention possesses the same as or even higher critical temperature than the known Tl-system or Bi-system superconducting compound oxides and shows much higher critical current density than the known systems. Still more, the problem of pollution caused by toxic thallium vapour is lightened.

The superconducting compound oxide according to the present invention can be utilized advantageously in applications of superconducting wire, rod, parts such as magnets, thick film or thin film devices, such as Matisoo switching elements or Josephson device, Anacker memory device, a variety of sensors or Superconducting Quantum Interference Device (SQUID).

Now, embodiments of the process according to the present invention will be described by Examples, but the scope of the present invention should not be limited thereto.

EXAMPLE 1

Powders of commercially available CaO, BaO$_2$, Cs$_2$CO$_3$ and CuO (each having purity of higher than 99.9%) are weighted and mixed intimately in such a manner that the atomic ratios of respective elements Ca, Ba, Cs and Cu in the mixture become the values listed in Table 1.

The powder mixture of CaO, BaO$_2$, Cs$_2$CO$_3$ and CuO is sintered preliminarily in air and then the resulting preliminarily sintered mass is pulverized. Then, the resulting pulverized preliminary sintered powder is mixed with a powder of commercially available Tl$_2$O$_3$ in such a manner that the atomic ratios of respective elements Tl, Ca, Ba, Cs and Cu in the mixture become the values listed in Table 1.

Then, the resulting material powder mixture is compacted by a press into a pellet (a diameter of 8 mm and a thickness of 2 mm). The pellet is wrapped with a foil made of gold and then is sintered at 850° C. for 12 hours in oxygen gas stream.

Four samples of material powder mixtures according to the present invention and two comparative examples whose compositions are outside the scope of the present invention (Comparative Samples) are prepared.

For another comparison, the same operation as above is repeated for a sample which doesn't contain $Cs_2CO_3$ (Sample of a known composition).

Figure 1:
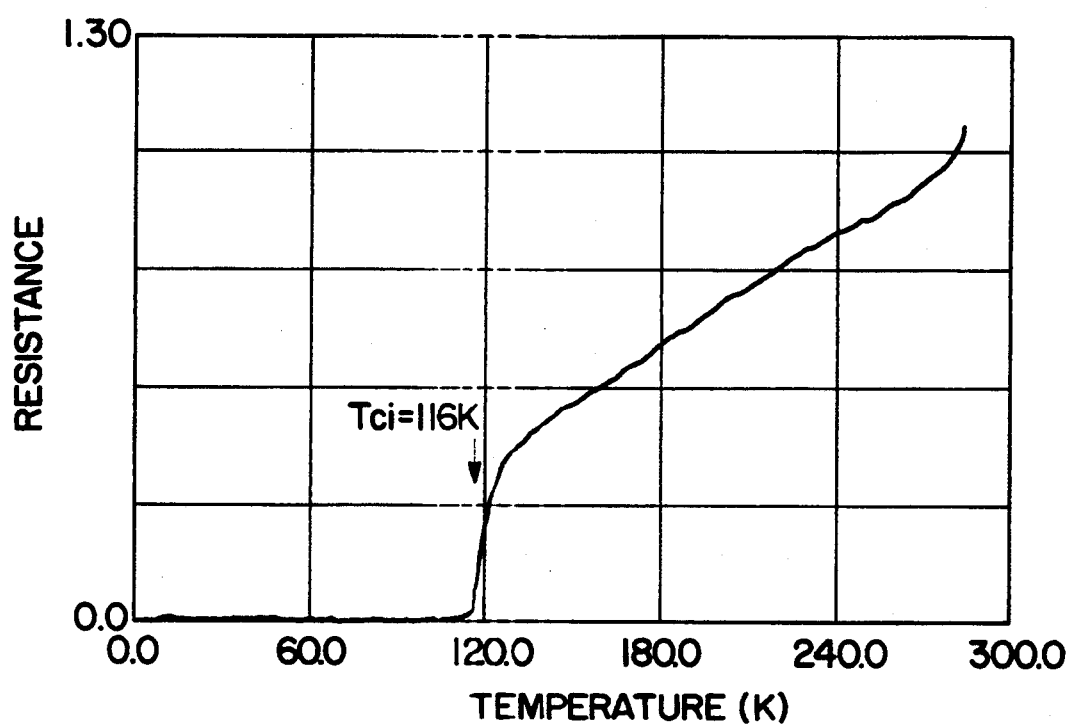
FIG. 1 is a temperature dependency of resistance of a superconductor according to the present invention which is obtained by Sample No. 3 in Example 1 in which the atomic ratios of Tl:Ca:Ba:Cs:Cu in the material powder mixture are adjusted to 2:2:1:1:3.

The critical temperature (Tc) of the sintered mass obtained is determined by usual four probe method. Temperature is measured by a calibrated Au(Fe)—Ag thermocouple. FIG. 1 shows an example of temperature dependency of resistance measured on a superconductor obtained from Sample No. 3 in which the atomic ratios of Tl:Ca:Ba:Cs:Cu in the material powder mixture are adjusted to 2:2:1:1:3.

Figure 2:
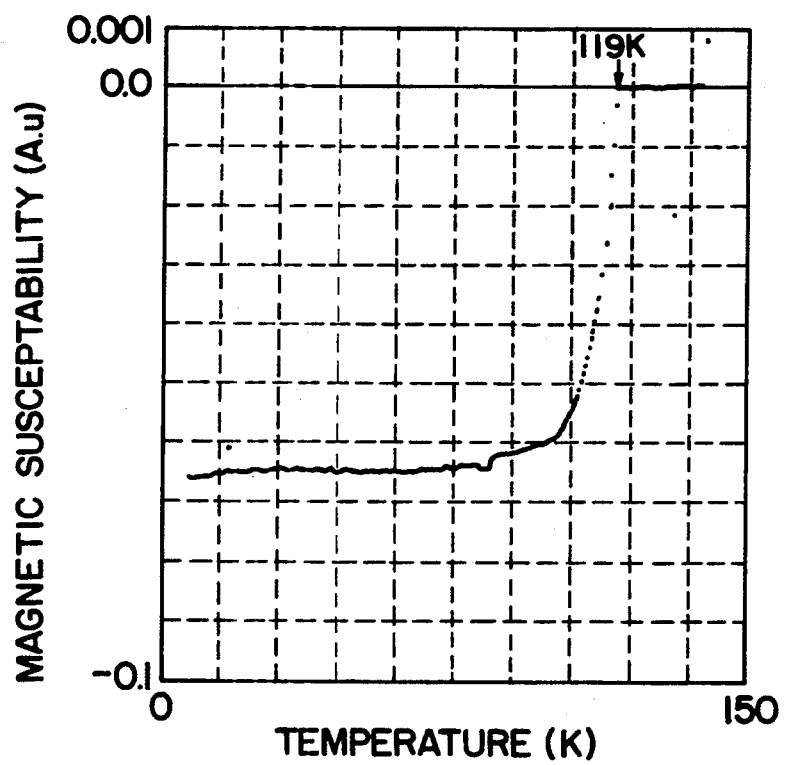
FIG. 2 is a temperature dependency of magnetic susceptibility of another superconductor according to the present invention which is obtained by Sample No. 2 in Example 1 in which the atomic ratios of Tl:Ca:Ba:Cs:Cu in the material powder mixture are adjusted to 2:2:1.8:0.2:3.

FIG. 2 is an example of temperature dependency of magnetic susceptibility of another superconductor obtained from Sample No. 2 in which the atomic ratios of Tl:Ca:Ba:Cs:Cu in the material powder mixture are adjusted to 2:2:1.8:0.2:3.

Figure 3:
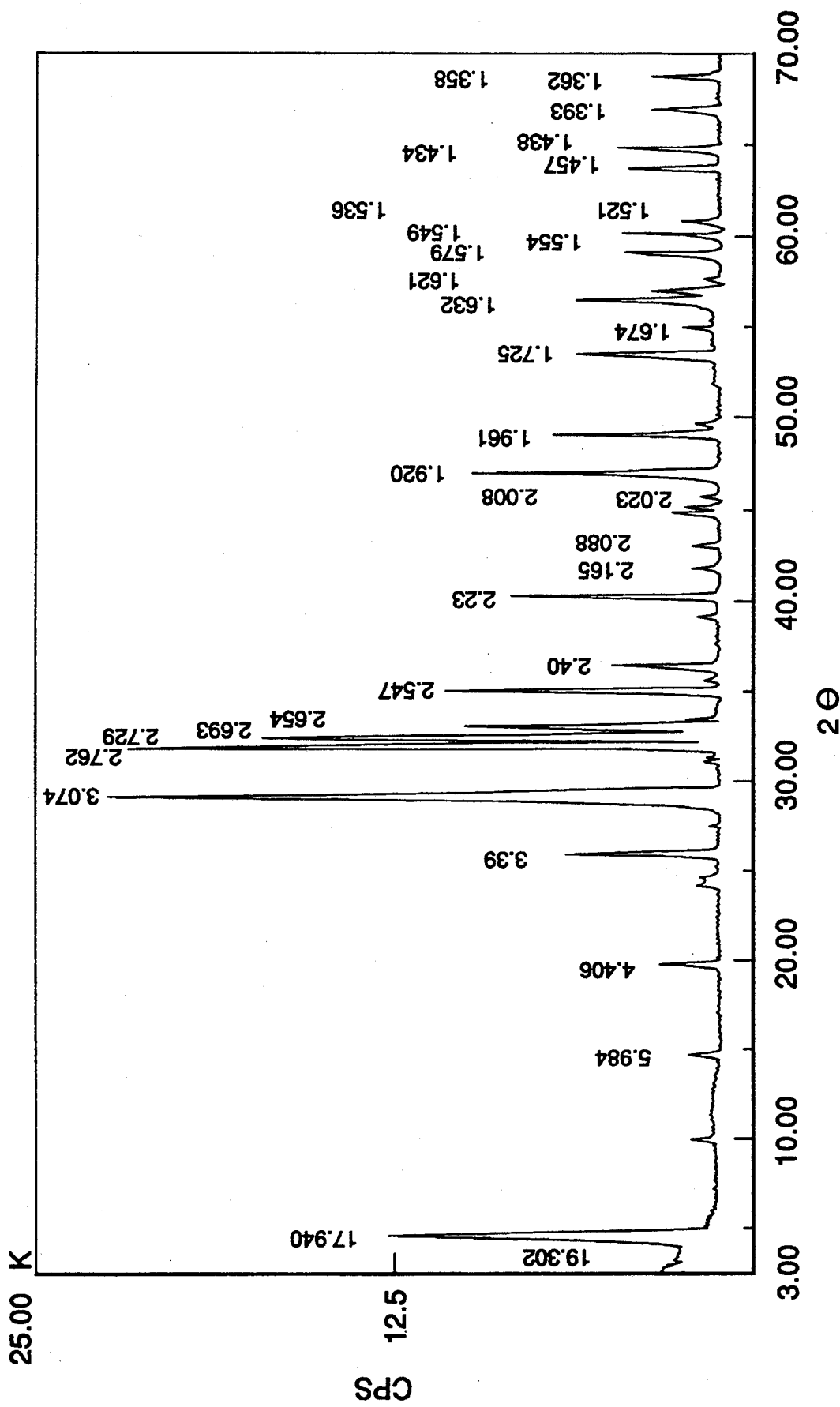
FIG. 3 is a X-ray diffraction pattern of the superconductor of FIG. 2 (Sample No. 2 of Example 1).

FIG. 3 is an example of X-ray diffraction pattern of the superconductor of FIG. 2 (Sample No. 2). This X-ray diffraction pattern shows such a fact that the superconductor of FIG. 2 (Sample No. 2) consists of a pure $Tl_2Ca_2Ba_2Cu_3O_x$ type crystal structure but contains substantially no different phases.

The critical current density (Jc) of the sintered mass obtained is determined at 77.0 K and is expressed by $A/cm^2$.

The results are summarized in Table 1.

TABLE 1

| Sample No. | atomic ratios |  |  |  |  | Tc (K) | Jc (A/cm²) (at 77 K) |
|---|---|---|---|---|---|---|---|
|  | Tl | Ca | Ba | Cs | Cu |  |  |
| Known | 2 | 2 | 2.0 | — | 3 | 110 | 300 |
| 1 | 2 | 2 | 1.90 | 0.10 | 3 | 113 | 850 |
| 2 | 2 | 2 | 1.80 | 0.20 | 3 | 116 | 1000 |
| 3 | 2 | 2 | 1.00 | 1.00 | 3 | 116 | 1200 |
| 4 | 2 | 2 | 0.40 | 1.60 | 3 | 117 | 800 |
| Comp. 1 | 2 | 2 | 1.95 | 0.05 | 3 | 114 | 350 |
| Comp. 2 | 2 | 2 | 0.20 | 1.80 | 3 | * | ** |

Note:
Known = a known composition
Comp. = comparative examples
*superconductivity is not exhibited above 4.2 K
**superconductivity is not exhibited above 77 K

EXAMPLE 2

In this examples, a portion of thallium (Tl) is replaced by lead (Pb) and/or bismuth (Bi) to produce a variation of the system shown in Example 1.

The Example 1 is repeated except that $Bi_2O_3$ and PbO are further added to the material powder mixture.

The atomic ratios of elements and the results of the critical temperature (Tc) and the critical current density (Jc) determined by the same method as Example 1 measure on the resulting sintered mass are summarized in Table 2.

TABLE 2

| Sample No. | atomic ratios |  |  |  |  |  |  | Tc (K) | Jc (A/cm²) (at 77 K) |
|---|---|---|---|---|---|---|---|---|---|
|  | Tl | Bi | Pb | Ca | Ba | Cs | Cu |  |  |
| 5 | 1.6 | 0.4 | 0 | 2 | 1.6 | 0.4 | 3 | 113 | 900 |
| 6 | 1.6 | 0.4 | 0 | 2 | 1.0 | 1.0 | 3 | 114 | 1100 |
| 7 | 1.6 | 0.4 | 0 | 2 | 0.4 | 1.6 | 3 | 112 | 800 |
| 8 | 1.6 | 0 | 0.4 | 2 | 1.6 | 0.4 | 3 | 116 | 1200 |
| 9 | 1.6 | 0 | 0.4 | 2 | 1.0 | 1.0 | 3 | 114 | 1100 |
| 10 | 1.6 | 0 | 0.4 | 2 | 0.4 | 1.6 | 3 | 115 | 1100 |
| 11 | 1.6 | 0.2 | 0.2 | 2 | 1.0 | 1.0 | 3 | 114 | 1000 |
| 12 | 1.6 | 0.2 | 0.2 | 2 | 0.4 | 1.6 | 3 | 115 | 1050 |
| 13 | 1.6 | 0.2 | 0.4 | 2 | 1.6 | 0.4 | 3 | 113 | 950 |

EXAMPLE 3

The Example 1 is repeated except that $BaO_2$ is replaced by $SrO_2$.

The atomic ratios of elements and the results of the critical temperature (Tc) and the critical current density (Jc) determined by the same method as Example 1 measured on the resulting sintered mass are summarized in Table 3.

TABLE 3

| Sample No. | atomic ratios |  |  |  |  | Tc (K) | Jc (A/cm²) (at 77 K) |
|---|---|---|---|---|---|---|---|
|  | Tl | Ca | Sr | Cs | Cu |  |  |
| Known | 2 | 2 | 2.00 | — | 3 | 70 | —** |
| 14 | 2 | 2 | 1.90 | 0.1 | 3 | 100 | 500 |
| 15 | 2 | 2 | 1.80 | 0.2 | 3 | 100 | 700 |
| 16 | 2 | 2 | 1.00 | 1.0 | 3 | 105 | 1000 |
| 17 | 2 | 2 | 0.40 | 1.6 | 3 | 103 | 850 |
| Comp. 1 | 2 | 2 | 1.95 | 0.05 | 3 | 72 | —** |
| Comp. 2 | 2 | 2 | 0.20 | 1.8 | 3 | —** |  |

Note:
Known = a known composition
Comp. = comparative examples
*superconductivity is not exhibited above 4.2 K
**superconductivity is not exhibited above 77 K

EXAMPLE 4

The Example 3 is repeated except that $Bi_2O_3$ and PbO are further added to the material powder mixture.

The atomic ratios of elements and the results of the critical temperature (Tc) and the critical current density (Jc) determined by the same method as Example 3 measured on the resulting sintered mass are summarized in Table 4.

TABLE 4

| Sample No. | atomic ratios |  |  |  |  |  |  | Tc (K) | Jc (A/cm²) (at 77 K) |
|---|---|---|---|---|---|---|---|---|---|
|  | Tl | Bi | Pb | Ca | Sr | Cs | Cu |  |  |
| 18 | 1.6 | 0.4 | 0 | 2 | 1.6 | 0.4 | 3 | 105 | 1000 |
| 19 | 1.6 | 0.4 | 0 | 2 | 1.0 | 1.0 | 3 | 107 | 1200 |
| 20 | 1.6 | 0.4 | 0 | 2 | 0.4 | 1.6 | 3 | 103 | 920 |
| 21 | 1.6 | 0 | 0.4 | 2 | 1.6 | 0.4 | 3 | 110 | 1350 |
| 22 | 1.6 | 0 | 0.4 | 2 | 1.0 | 1.0 | 3 | 109 | 1300 |
| 23 | 1.6 | 0 | 0.4 | 2 | 0.4 | 1.6 | 3 | 107 | 1200 |
| 24 | 1.6 | 0.2 | 0.2 | 2 | 1.6 | 0.4 | 3 | 104 | 950 |
| 25 | 1.6 | 0.2 | 0.2 | 2 | 1.0 | 1.0 | 3 | 105 | 1020 |
| 26 | 1.6 | 0.2 | 0.2 | 2 | 0.4 | 1.6 | 3 | 103 | 900 |

It is confirmed that the almost same results are obtained when the respective oxides of the material powders are replaced by carbonates.

I claim:

1. A superconducting material principally comprising a compound oxide represented by the general formula:

$Tl_{h(1-p-q)}Bi_{hp}Pb_{hq}Ca_j\alpha_{k(1-y)}Cs_{ky}Cu_mO_n$ wherein

"α" represents Ba or Sr; and

"h", "j", "k", "m" and "n" are the atomic ratios satisfying the following ranges:
$1 \leq h \leq 3$, $1 \leq j \leq 3$, $1 \leq k \leq 3$,
$2 \leq m \leq 4$ and $5 \leq n \leq 15$ and
"y" is a number satisfying $0.05 \leq y \leq 0.8$, and "p" and "q" are numbers satisfying $0 < p < 0.5$ and $0 \leq q < 0.5$.

2. A superconducting material principally comprising a compound oxide represented by the general formula:

$$Tl_h Ca_j \alpha_{k(1-y)} Cs_{ky} Cu_m O_n$$

wherein
"α" represents Ba or Sr; and
"h", "j", "k", "m" and "n" are the atomic ratios each satisfies the following range:
$1 \leq h \leq 3$, $1 \leq j \leq 3$, $1 \leq k \leq 3$,
$2 \leq m \leq 4$ and $5 \leq n \leq 15$ and
"y" is a number satisfying the range of $0.05 \leq y \leq 0.8$.

3. The superconducting material according to claim 1 wherein said compound oxide has a crystal structure of tetragonal system.

* * * * *